United States Patent
Whitted

(10) Patent No.: US 7,864,527 B1
(45) Date of Patent: Jan. 4, 2011

(54) SYSTEMS AND METHODS FOR CLOSE COUPLED COOLING

(75) Inventor: William H. Whitted, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 10/816,585

(22) Filed: Mar. 31, 2004

(51) Int. Cl.
  H05K 7/20 (2006.01)
  F28F 7/00 (2006.01)
  H05K 5/00 (2006.01)
  F25D 23/12 (2006.01)

(52) U.S. Cl. .............. 361/696; 361/724; 361/727; 361/701; 361/695; 165/80.3; 165/104.33; 454/184; 62/259.2

(58) Field of Classification Search .......... 361/696, 361/679.48, 679.49, 679.53, 699–702, 724–727; 454/184; 165/80.3–80.4, 104.33
See application file for complete search history.

(56) References Cited

U.S. PATENT DOCUMENTS

| | | | |
|---|---|---|---|
| 3,777,506 A | 12/1973 | Hergatt et al. | |
| 3,889,746 A * | 6/1975 | Laffranchi | 165/155 |
| 3,925,679 A | 12/1975 | Berman et al. | |
| 5,544,012 A | 8/1996 | Koike | |
| 5,722,483 A | 3/1998 | Gibson | |
| 5,740,018 A * | 4/1998 | Rumbut, Jr. | 361/720 |
| 5,788,858 A | 8/1998 | Acernese et al. | |
| 5,924,581 A | 7/1999 | Chen | |
| 6,034,873 A | 3/2000 | Ståhl et al. | |
| 6,176,046 B1 | 1/2001 | Quine et al. | |
| 6,205,796 B1 * | 3/2001 | Chu et al. | 62/94 |
| 6,374,627 B1 | 4/2002 | Schumacher et al. | |
| 6,407,567 B1 * | 6/2002 | Etter | 324/760 |
| 6,412,292 B2 | 7/2002 | Spinazzola et al. | |
| 6,481,492 B1 * | 11/2002 | Zhu et al. | 165/109.1 |
| 6,494,050 B2 | 12/2002 | Spinazzola et al. | |
| 6,506,111 B2 | 1/2003 | Sharp et al. | |
| 6,530,347 B2 * | 3/2003 | Takahashi et al. | 123/41.1 |
| 6,601,542 B2 | 8/2003 | Campion | |
| 6,628,520 B2 | 9/2003 | Patel et al. | |
| 6,652,373 B2 | 11/2003 | Sharp et al. | |

(Continued)

OTHER PUBLICATIONS

Baumgart et al., Petabyte Box for Internet Archive, Nov. 8, 2003 (6 pages).

(Continued)

*Primary Examiner*—Zachary M Pape
(74) *Attorney, Agent, or Firm*—Fish & Richardson P.C.

(57) ABSTRACT

Systems and methods for close coupled cooling of electrical system components such as computer systems are disclosed. The system may include a structure defining spaces each having an inlet and an outlet and being otherwise generally enclosed in which the electronic components are mounted, a heat exchanger either adjoining the structure at the inlets of the spaces or disposed within the spaces at the inlets and configured to channel a heat exchange fluid to cool air as air flows therethrough, a fan disposed in each space to pull air through the inlet via the heat exchanger, to direct air past the electronic components mounted therein to cool the electronic components, and to exhaust the air through the outlet, and a cooling module located remote to the spaces and in fluid communication with the heat exchanger for cooling the heat exchange fluid. The system may include rack mount computer system structures.

22 Claims, 6 Drawing Sheets

U.S. PATENT DOCUMENTS

| | | | |
|---|---|---|---|
| 6,714,412 B1 * | 3/2004 | Chu et al. | 361/699 |
| 6,775,137 B2 | 8/2004 | Chu et al. | |
| 6,786,056 B2 | 9/2004 | Bash et al. | |
| 6,819,563 B1 * | 11/2004 | Chu et al. | 361/696 |
| 6,859,366 B2 | 2/2005 | Fink | |
| 7,106,590 B2 | 9/2006 | Chu et al. | |
| 7,170,745 B2 | 1/2007 | Bash et al. | |
| 7,309,279 B2 | 12/2007 | Sharp et al. | |
| 7,477,514 B2 | 1/2009 | Campbell et al. | |
| 2002/0139554 A1 * | 10/2002 | Kubota et al. | 174/50 |
| 2002/0190868 A1 * | 12/2002 | Dearborn et al. | 340/691.1 |
| 2003/0053293 A1 * | 3/2003 | Beitelmal et al. | 361/687 |
| 2003/0147214 A1 * | 8/2003 | Patel et al. | 361/699 |
| 2004/0100770 A1 * | 5/2004 | Chu et al. | 361/698 |
| 2004/0132398 A1 | 7/2004 | Sharp et al. | |
| 2006/0065000 A1 | 3/2006 | Belady | |
| 2006/0082263 A1 | 4/2006 | Rimler et al. | |
| 2008/0094797 A1 | 4/2008 | Coglitore et al. | |

OTHER PUBLICATIONS

Designing & Building Efficient Data Centers, PlanetTen, Jul. 2003 (23 pages).
Final Office Action in U.S. Appl. No. 11/869,586 dated Feb. 5, 2010 (25 pages).
Final Office Action in U.S. Appl. No. 12/165,506 dated Jan. 26, 2010 (8 pages).

* cited by examiner

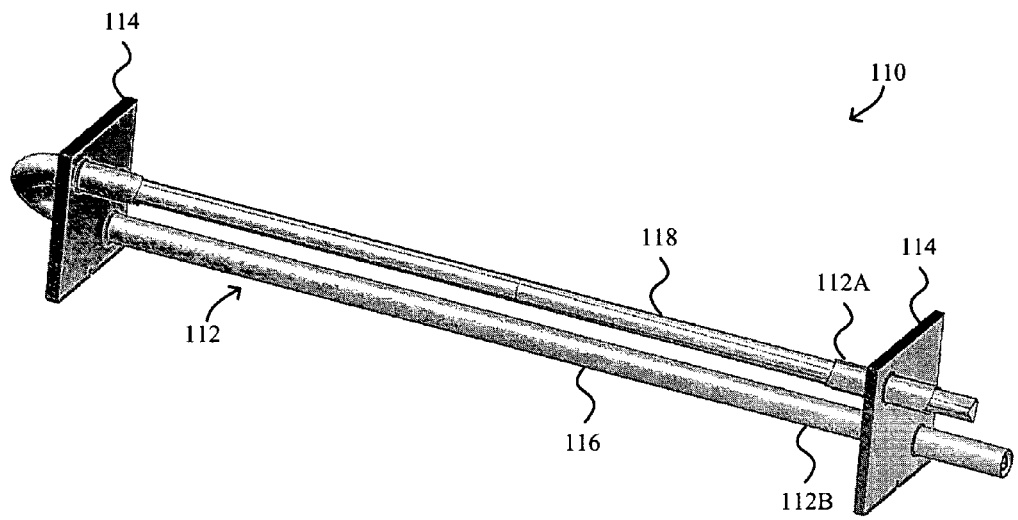
FIG. 3
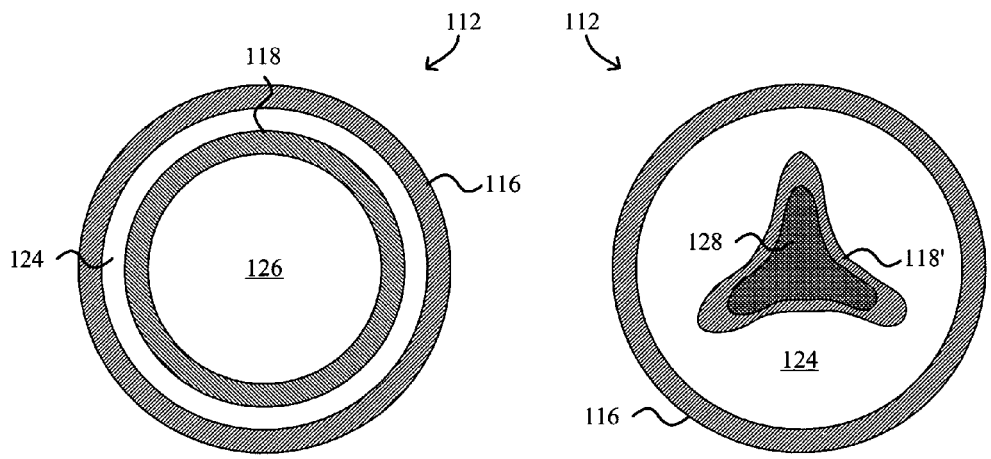
FIG. 4  FIG. 5

SYSTEMS AND METHODS FOR CLOSE COUPLED COOLING

BACKGROUND OF THE INVENTION

1. Field of the Invention

The present invention relates generally to climate control of electrical system components. More specifically, systems and methods for close coupled cooling of electrical system components such as computer systems are disclosed.

2. Description of Related Art

With the increasing density and power usage of computer systems in server farms, data centers, and collocation facilities, heat generated by the computer systems has increased and cooling systems used for heat extraction have become increasingly more complex and less direct and thus less efficient and more expensive. Heat in computer systems is generally generated by the operation of hot components such as central processing units (CPUs), memory, disk drives, power supplies, and various other high-powered, board-mounted components. As excess heat reduces the efficiency and life of the components and thus the systems, heat extraction systems are commonly employed for climate control purposes. The heat extraction systems transfer the heat generated by the hot computer components to the atmosphere or other global scale heat sink outside of the building or other enclosure housing the computers. However, the complex heat extraction systems with loosely coupled heat transfer result in increased cost and decreased cooling efficiency.

A typical heat extraction or cooling system at a collocation employs a computer room air conditioning (CRAC) system in which the air in a sealed computer room or building is cooled by one of several mechanisms that eventually transfer heat from the computer room's air to the outside environment. For example, one mechanism provides heat transfer by circulating chilled water through a cooling coil in the CRAC. Another mechanism uses a direct expansion evaporator coil in the CRAC. In both mechanisms, the computer room air is drawn into the CRAC, ducted past the chilled coils and then returned to the computer room where it can eventually remove heat from the individual components of the computers.

With a typical CRAC, cooled air may be distributed through a raised floor plenum or other distribution ducting within the computer room. For example, the CRAC may deliver cooled air through a distribution system and expel the cooled air into the computer room through a number of vented floor tiles located near the computer racks or cabinets at a substantial vertical velocity. As the air flows vertically up along the side(s) of a computer rack, fans installed in the individual computers of the computer rack cause a portion of the cooled air to flow horizontally through the individual computers which in turn cause heat transfer between the computer components and the horizontally moving cooled air. The now-heated air is exhausted from the individual computer and the computer rack and typically rises toward the ceiling of the computer room. Ideally, the heated air is directly drawn back into the CRAC by large air circulating fans. Once the air is returned to the CRAC, the air circulation path is complete and can begin again for recirculation.

Although in ideal situations such a recirculation path may achieve good efficiency, computer systems in collocations are far from ideal. For example, the normal design expectation is that over 25% of the cooled air never reaches the computer components that the cooled air is intended to cool. In actual installed systems, as much as 50% of the cooled air may fail to reach the hot computer components.

Several factors contribute to the inefficiency. For example, chilled air can short circuit, i.e., flow directly from the vented floor tiles to the ceiling, and be drawn back into the CRAC before it passes through the computer racks to cool the individual components. As another example, the computer room may contain many leaks, such as those resulting from electrical and other utility connections that require penetrations through the walls of the computer room, that allow the cooled air to escape into spaces that are not intended to be conditioned. As yet another example, the air exiting the CRAC is often at temperatures as low as 50° F. while temperatures on the outside of the computer room's walls, ceiling, and floor can be at temperatures above 80° F. As a result of the high temperature gradients as well as the typical lack of insulation and large surface areas of the walls, ceiling, and floor, the exterior heat transferred into computer room is also transferred to the cooled air before and/or after the cooled air has circulated past the components of the individual computers. Various other factors also contribute to the inefficiency of typical CRAC systems. The inefficiencies greatly add to the cost as the heat transfer systems must have correspondingly larger cooling capacities which in turn require corresponding larger power usages.

Thus what is needed is a cost effective and reliable cooling or heat transfer system such as for cooling computer systems. Ideally, the cooling or heat transfer system also allows for quick, easy, and inexpensive repair and replacement of computer components and computer systems.

SUMMARY OF THE INVENTION

Systems and methods for close coupled cooling of electrical system components such as computer systems are disclosed. It should be appreciated that the present invention can be implemented in numerous ways, including as a process, an apparatus, a system, a device, a method, or a computer readable medium such as a computer readable storage medium or a computer network wherein program instructions are sent over optical or electronic communication lines. Several inventive embodiments of the present invention are described below.

A system for cooling electronic components may generally include a structure defining spaces each having an inlet and an outlet and being otherwise generally enclosed in which the electronic components are mounted, a heat exchanger either adjoining the structure at the inlets of the spaces or disposed within the spaces at the inlets and configured to channel a heat exchange fluid to cool air as air flows therethrough, a fan disposed in each space to pull air through the inlet via the heat exchanger, to direct air past the electronic components mounted therein to cool the electronic components, and to exhaust the air through the outlet, and a cooling module located remote to the spaces and in fluid communication with the heat exchanger for cooling the heat exchange fluid. The system may include rack mount computer system structures. The system may include a facility that containing several of the structures, heat exchangers and fans and in which the air drawn by the fans is the ambient air in the facility.

The system may include multiple heat exchangers each corresponding to one of the spaces. A fan controller corresponding to each fan may be provided to variably control the speed of the corresponding fan according to a temperature within the corresponding space and/or a temperature of one or more of the electronic components mounted within the space. The valve in fluid communication with the heat exchanger and the cooling module and a valve controller may also be provided to modulate the flow rate of the heat exchange fluid according to a temperature and/or pressure of the heat exchange fluid. The cooling module may be a direction expansion condensing unit, for example.

Each heat exchanger may include a heat exchange fluid channeling device and a heat exchange apparatus in thermal communication with the heat exchange fluid channeling device. For example, the heat exchange apparatus may include heat exchange finned tubing through which the heat exchange fluid channeling device extends. The heat exchange fluid channeling device may include an external member and an inner baffle defining an annular channel therebetween and through which the heat exchange fluid flows. The heat exchange fluid channeling device may be U-shaped to provide a supply and a return portion to supply and return the heat exchange fluid from and to the cooling module, respectively.

According to an alternative embodiment, a system for cooling electronic components may generally include means for defining a plurality of spaces, each space having an inlet and an outlet and being otherwise generally enclosed and containing at least one of the electronic components mounted therein, means for containing a plurality of the means for defining the spaces, means for cooling air, the means for cooling air being one of adjoining the inlets of the spaces and disposed within the plurality of spaces at the inlets of the spaces, and means for directing the air from ambient air in the means for containing through the inlet to the outlet of the spaces and past the means for cooling.

According to another alternative embodiment, a method for cooling electronic components may generally include providing a structure defining a plurality of spaces, each space having an inlet and an outlet and being otherwise generally enclosed and containing at least one of the electronic components mounted therein, moving air through the inlet of each space, cooling the air by exchanging heat between a heat exchange fluid and the air at a location, the location being one of adjoining the structure at the inlets of the spaces and disposed within the plurality of spaces at the inlets of the spaces, directing the air past at least one electronic component mounted in the space to cool the electronic component, and exhausting the air through the outlet.

These and other features and advantages of the present invention will be presented in more detail in the following detailed description and the accompanying figures which illustrate by way of example principles of the invention.

BRIEF DESCRIPTION OF THE DRAWINGS

The present invention will be readily understood by the following detailed description in conjunction with the accompanying drawings, wherein like reference numerals designate like structural elements.

FIG. 3 is a perspective view illustrating an exemplary configuration of a U-shaped heat transfer fluid line of the heat exchange apparatus in more detail.

FIG. 4 is a cross-sectional view of the illustrative cooling tube of FIG. 3.

FIG. 5 is a cross-sectional view of the illustrative cooling tube of FIG. 3 at another location.

DESCRIPTION OF SPECIFIC EMBODIMENTS

Systems and methods for close coupled cooling of electrical system components such as computer systems are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
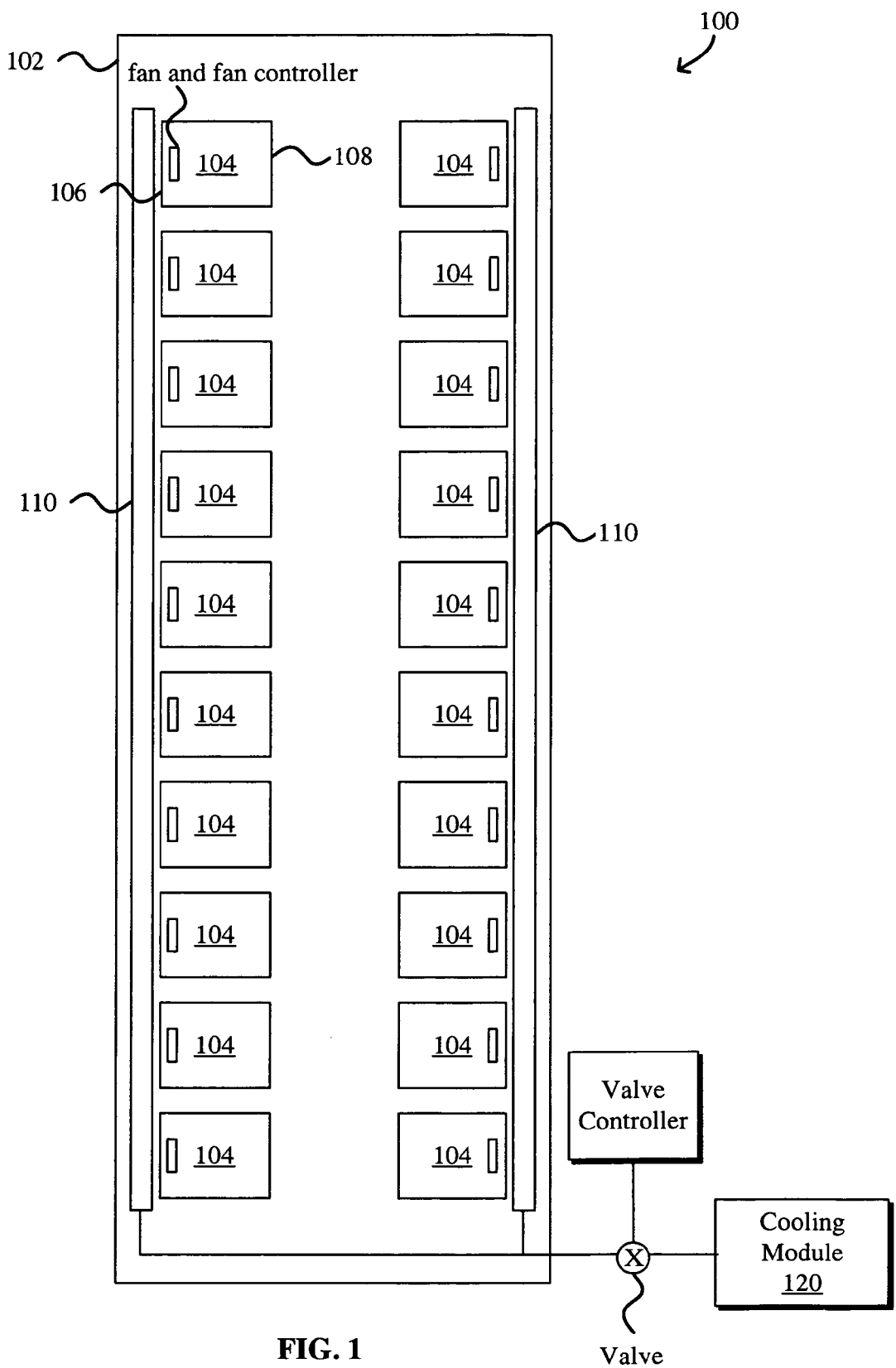
FIG. 1 is a schematic diagram of an illustrative computing facility such as a server farm or a collocation facility containing numerous rack mounted computer systems

FIG. 1 is a schematic diagram of an illustrative computing facility 100 such as a server farm or a collocation facility containing various rack mounted computer systems. The computing facility 100 may include a computer room 102, a collocation facility, or other enclosure or container housing numerous racks 104 or other computer system mounting mechanisms such as cabinets, chassis, housings or the like. Several modular trays or boards each containing or housing a computer system are typically vertically stacked and mounted in the rack 104 via mounting rails or other suitable mechanisms. Each tray may hold a number of computer components such as central processing units (CPUs), memory, disk drives, power supplies, input/output cards and interfaces, heat sinks, cooling hardware, etc. Although the computer systems are described as being rack mounted and an illustrative configuration of a computing facility 100 is illustrated and described, it is to be understood that the systems and methods for close coupled cooling presented herein may be adapted to various other computer or other electronic systems in different configurations.

The components of the rack mounted computer systems may be cooled by a cooling system that includes a cooling module 120 and a heat transfer or heat exchange apparatus 110. Although the cooling module 120 is shown located external to the computing facility 100, the cooling module 120 may be integrated into the computing facility 100. As another alternative, a separate cooling module 120 may be provided for and located within each rack. The cooling module 120 is configured to cool the heat exchange fluid contained in the heat exchange apparatus 110. As an example, the cooling module 120 may include a water chiller, direction expansion condensing unit, or the like.

To cool the computer components, each rack 104 may have opposing open sides 106, 108 to allow air flow past the heat exchange apparatus 110 and the computer components mounted on the trays within the racks 104. Alternatively, rather than having opposing open sides 106, 108, the racks 104 and/or or the trays may be configured to provide openings through which air may be circulated. The flow of the cooled air is generally directed through the confines or enclosure of each computer system tray. For example, each computer system tray may be generally enclosed on one side, e.g., bottom, by the tray itself, on the opposite, e.g., top, by the computer system tray immediately above (or by the ceiling of the rack 104), and on another two sides by the side walls of the rack 104 or the tray itself. As noted, the computer system enclosure generally has two open ends for directing the air flow therethrough.

Figure 2A:
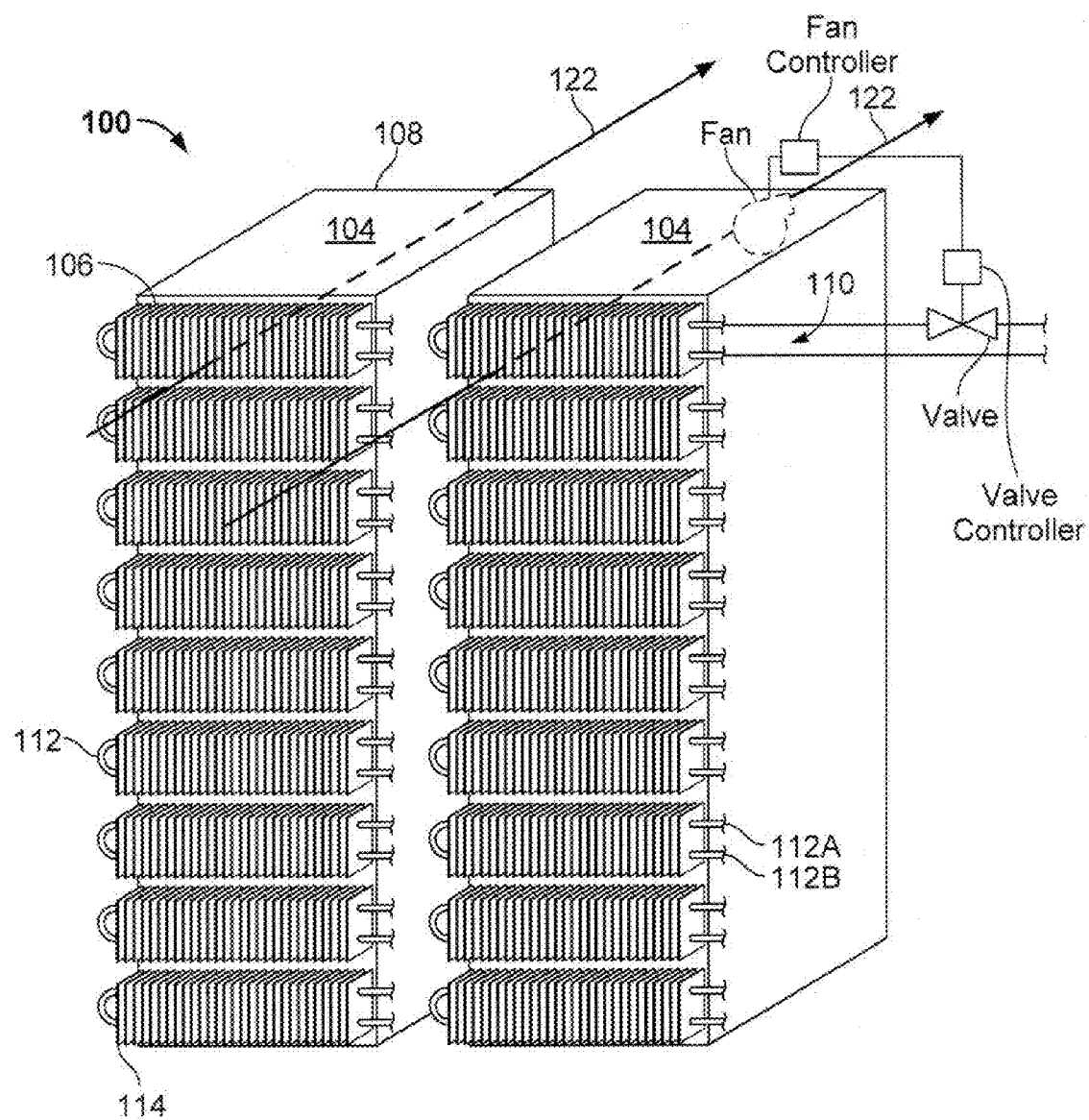
FIG. 2A is a perspective view illustrating two adjacent racks of the computing facility and the associated heat exchange apparatus.

FIG. 2A is a perspective view illustrating two adjacent racks 104 of the computing facility 100 and the associated heat exchange apparatus 110. As shown, the heat exchange apparatus 110 may include U-shaped heat transfer fluid lines 112 for carrying a heat transfer fluid or coolant therein. The heat transfer fluid lines 112 are in fluid communication with the cooling module (shown in FIG. 1) for cooling the heat transfer fluid. The U-shaped heat transfer fluid line 112 may include a supply line 112A and a return line 112B for supplying and returning the heat transfer fluid from and to the cooling module 120, respectively. A separate U-shaped heat transfer fluid line 112 may be provided for each level or tray in the racks along a given row of racks. For example, if each rack 104 generally houses 40 computer system trays, 40 separate U-shaped heat transfer fluid line 112 may be provided for each row of the racks 104, i.e., 80 heat transfer fluid lines 112 for the two rows of the racks 104. However, various other configuration of heat exchange apparatuses 110 may be employed. In addition, although each heat exchange apparatus 110 is shown to be the same size, shape and configuration, each heat exchange apparatus 110 may be configured differently from each other. Furthermore, although the heat exchange apparatus 110 is shown to span horizontally across multiple racks at the same level or height, a separate heat exchange apparatus 110 may be provided for each computer system tray in the racks. As yet another example, the heat exchange apparatus 110 may span vertically such that each heat exchange apparatus 110 provides cooling only for one corresponding rack of computer systems. Similarly, although the computer systems are typically in a horizontal orientation, the computer systems may be vertically oriented and the heat exchange apparatuses 110 can be adapted thereto.

The heat transfer fluid lines 112 of the heat exchange apparatus 110 may carry chilled water, particularly when utilized in low power computing facilities, for example. As another example, the heat transfer fluid lines 112 may carry direct expansion refrigerants, particularly when utilized in higher power computing facilities, for example. Various other heat transfer fluids may be employed and may include, for example, chilled air, phase change refrigerants, brine, antifreeze mixes, oil, and/or various other heat transfer fluids. The specific heat transfer fluid selected may be of a capacity to sufficiently cool the ambient air in the computing facility 100 on a single pass through the heat transfer apparatus 110 so that the cooled air may remove sufficient heat from and maintain the desired temperature for the computer components.

To facilitate heat exchange, the heat exchange apparatus 110 may include a number of heat exchange fins 114 generally perpendicular to the heat transfer fluid lines 112. The fins 114 may be attached to the heat transfer fluid line 112 so as to allow heat transfer therebetween. For example, the fins 114 may be attached by a frictional fit and/or by soldering, etc. The fins may be shaped and configured to maximize the surface area over which the air flows. As shown, each U-shaped heat transfer fluid line 112 is configured with a separate set of fins 114. In particular, each fin 114 may provide two openings through which the U-shaped heat transfer fluid line 112 may pass. In particular, the two sets of openings provided in the heat exchange fins 114 may correspond to the supply line 112A and the return line 112B. Alternatively, multiple U-shaped heat transfer fluid lines 112 may share a set of fins 114, for example. The fins 114 may be made from various materials that optimize heat exchange, e.g., materials with a low thermal resistance and a high thermal transfer coefficient. As an example, the heat transfer fins 114 may be made of a metal or metal alloy such as copper, steel, aluminum, and the like. The fins 114 are spaced apart relative to each other so as to allow sufficient airflow therebetween. The fins 114 may be approximately equally spaced along the length of the heat transfer fluid line 112 or may be absent from certain locations such as at locations without intended air flow as shown. The exact number, dimension, shape, and spacing of the fins 114 may be optimized depending on various system parameters, for example.

The finned and U-shaped heat transfer fluid line design is merely one example of a suitable configuration of the heat exchange apparatus 110. Alternative configurations of the heat exchange apparatus 110 may include evaporator cores, tube-in-panel radiators, chilled vanes, various other fluid (e.g., air) to fluid (e.g., gas, liquid, state change media) heat exchanger element with sufficient heat transfer ability, etc.

Figure 2B:
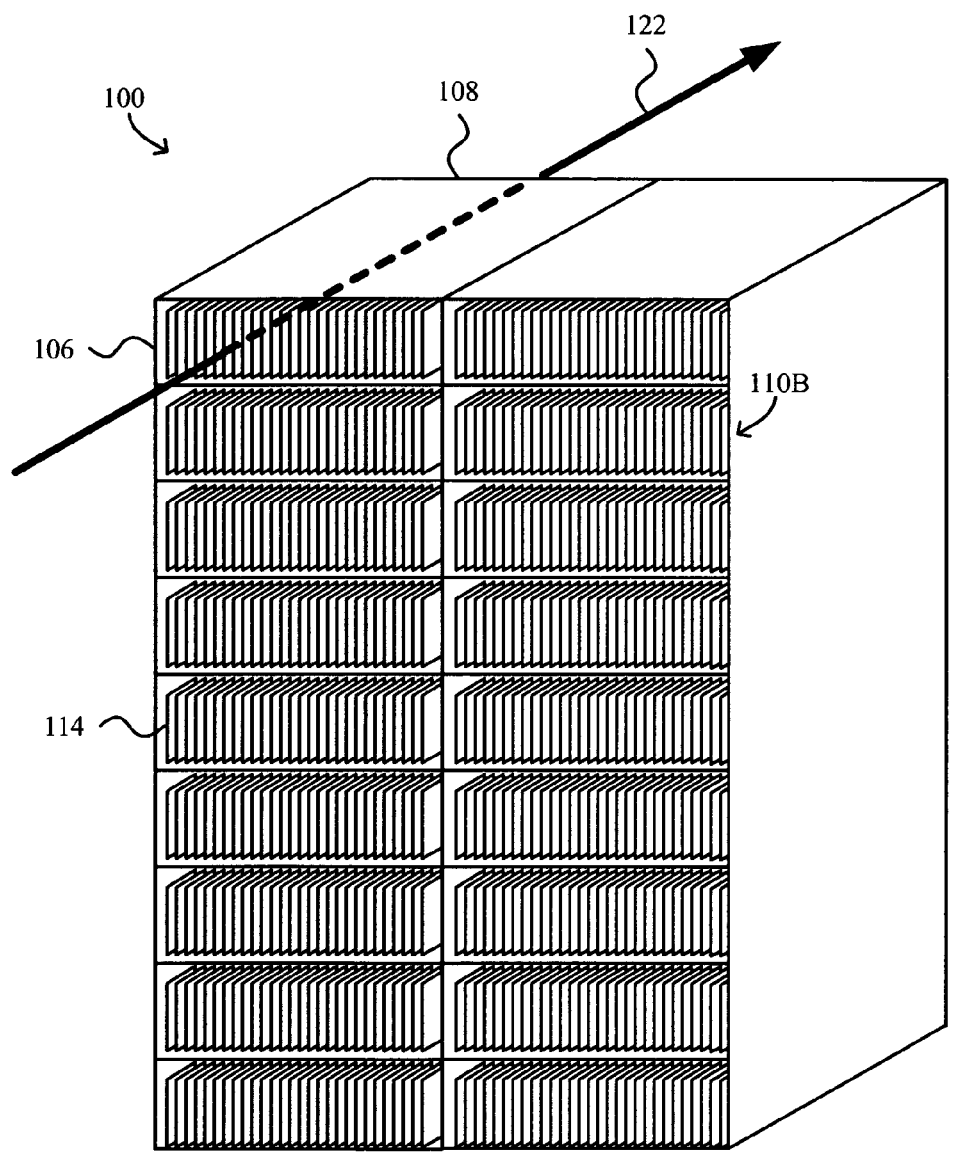
FIG. 2B is a perspective view of an alternative configuration in which the heat exchange apparatus is located within or otherwise integrated into the racks of the computing facility.

FIG. 2B is a perspective view of an alternative configuration in which the heat exchange apparatus 110B is located within or otherwise integrated into the racks 104 of the computing facility. One or more heat exchange apparatus 110B may be provided for each computer system shelf or may be shared among several computer system shelves for each rack 104.

In either of the embodiments shown of FIGS. 2A and 2B, the heat exchange apparatus 110 may be installed such that the individual computer system shelves may be accessed or removed for repair or replacement without interference from the heat exchange apparatus 110. In other words, the heat exchange apparatus 110 may be configured such that it does not need to be accessed or disconnected unless, for example, the entire rack 104 itself is moved or replaced as with the embodiment shown in FIG. 2B. Because the heat exchange apparatus 110 does not need to be accessed or disconnected, for example, for repair or replacement of computer systems or computer system components, the heat exchange apparatus 110 may be plumbed into the cooling system of the computing facility 100 in a robust, semi-permanent or even permanent manner and thus minimize the risk of fluid leaks at various connectors and joints.

The direction of air flow is indicated by arrow 122 in FIGS. 2A and 2B. As shown, the heat exchange apparatus 110 is immediately adjacent to or integrated into the confines or enclosure of the computer system enclosure or mounting shelf. Thus the heat exchange apparatus 110 is interposed into the air flow path of the individual rack mounted computer systems immediately before the cooling air flows past the area to be cooled, i.e., the shelves in the rack 104. In other words, because the air used for component cooling is chilled by the heat exchange apparatus 110 immediately prior to its use, very little opportunity exists for the cooled air to lose its cooling capacity to surrounding surfaces. Because most or all the cooling air is pulled past the heat exchange apparatus 110 and then immediately pulled and/or pushed across the components to be cooled, the opportunity for hot exhaust air to re-circulate and mix with the chilled air is also minimized. In addition, the computer systems are generally not competing against each other for chilled air as each computer system pulls its own air flow therethrough. Further, the temperature variation among the computer systems regardless of their location within the computing facility 100, e.g., low or high within the racks 104, is also minimized. Thus, as the air flow for component cooling is generally entirely contained within the confines of the computer enclosure or mounting shelf, expensive computer room air conditioning (CRAC) can be eliminated along with its large fan motors that consume large amounts of electrical power.

The cooling for each rack mount computer system may be individually controlled by individually and separately controlling the fan speed and thus the air flow rate for each computer system. In particular, the amount of heat exchange from the air to the heat transfer fluid of the heat exchange apparatus 110 is at least partly dependent on the air flow rate. To control the air flow rate, a closed-loop servo system utilizing existing components, circuits, and/or software of each rack mount computer system may be employed to control the air flow rate by controlling the speed of the fans provided on each computer system tray. The computer system may include built-in temperature sensors used to control components such as computer chassis fans, CPU heat sink fans, and power supply fans, for example. Thus, based on various parameters such as the temperature of the air available for cooling, the power dissipated by the components of the individual computer system, and the desired resultant cooled temperature of the components, each computer system can determine the desired flow rate of the cooled air and thus the speed of the fans. If the speed of the fans is within the range of available speeds, the computer systems can thus generally remain at relatively constant temperatures. As such, the temperature gradient amongst the computer systems of the computing facility 100 is reduced or minimized.

The flow rate and/or temperature of the heat transfer fluid delivered by the cooling module 120 via the heat exchange apparatus 110 may also be controlled. The heat exchange apparatus 110 may include a thermostatically controlled valve (or a back pressure valve where the heat transfer fluid is a phase change fluid) as the heat exchange process between the ambient air within the computing facility 100 and the heat transfer fluid in the heat exchange apparatus 110 increases the temperature of the heat transfer fluid. The thermostatically controlled valve may be controlled so as to control the flow rate and/or maintain the temperature of the heat transfer fluid and thus the temperature of the surfaces of the heat exchange apparatus 110 that are presented to the air flow.

The two control systems, i.e., the control of the fan speed of the individual computer systems and the control of the flow rate of the heat transfer fluid in the heat exchange apparatus 110, facilitate in maintaining the temperature of various critical computer components over a broad range of system loading conditions. These two control systems may communicate with each other to optimize the fan speed and the heat transfer fluid flow rate. Such control helps to minimize the flow of the cooled heat transfer fluid through the heat exchange apparatus 110 to achieve the proper cooling of the computer components. In addition, where the flow and pressure of the heat exchange fluid are monitored, the cooling module 120 may operate the pumps at the minimum power necessary for proper cooling of the computer components. The lower flow rates in turn reduces the working load on the cooling module 120 in cooling the heat transfer fluid. The lower flow rates also reduce the frictional heat generated in the plumbing between the site of the initial chilling and the heat exchange apparatus 110 near the computer components as well as reduce the wear on the pumps and the piping or plumbing. Pumping losses normally incurred by long delivery pipes and necessary pipe bends can thus be reduced. The cooling system thus reduces the energy lost to inefficiencies and waste and thus increases system efficiency.

To maximize the heat transfer between the heat exchange apparatus 110 and the air flowing past the heat exchange apparatus 110, the surface area of the heat transfer fluid line 112 available for cooling, i.e., the surface area between the heat exchange fins 114 and the heat transfer fluid line 112 and/or the surface area of the heat transfer fluid line 112 not covered by the fins 114 over which the air may directly flow, should be maximized. In addition, the heat transfer fluid flow within the heat transfer fluid line 112 should also be turbulent in order to maximize heat transfer.

Maximizing the ratio of surface area that the fluid contacts to the volume of fluid flow maximizes turbulent flow. For example, the diameter of a fluid line may be minimized for a given volume of fluid flow to maximize turbulent flow. However, minimizing the diameter of the fluid line also minimizes the surface area available for heat transfer to the fins. FIGS. 3-5 illustrate a configuration of the U-shaped heat transfer fluid line 112 that maximizes both the turbulent flow of the heat transfer fluid and the heat exchange surface area of the heat transfer fluid line 112. In particular, FIG. 3 is a perspective view illustrating an exemplary configuration of the U-shaped heat transfer fluid line 112 and a portion of the attached heat transfer fins 114 of the heat exchange apparatus 110 in more detail. The U-shaped heat transfer fluid line 112 is partially cut away in FIG. 3 to show its interior configuration. In addition, FIGS. 4 and 5 are cross-sectional views of the illustrative heat transfer fluid line 112 of FIG. 3 at different locations. For purposes of clarity, only a portion of the heat transfer fins 114 are shown in FIG. 3 and typically the entire length or a substantial portion thereof has heat transfer fins 114 attached thereto.

As shown in FIG. 4, the heat transfer fluid line 112 includes an external channel 116 and an inner member 118 to define an annular conduit or channel 124 therebetween through which the heat exchange fluid flows. Both the external channel 116 and the inner member 118 are shown to have a circular cross-sectional shape although various other shapes such as oval, ellipsoid, triangular, rectangular, polygonal, and the like, may be employed. Merely as example, the external channel 116 and the inner member 118 may be copper tubing with ½" and ⅜" outer diameter, respectively. The thickness of the wall of the external channel 116 may be approximately ¹⁄₃₂" such that the distance between the inner surface of the external channel 116 and the outer surface of the inner member 118, i.e., the thickness of the annular channel 124 is approximately ¹⁄₃₂". The inner member 118 may be solid or may be hollow to define a volume 126 as shown in FIG. 4. The volume 126 may contain air or other fluids. To prevent the heat exchange fluid in the annular channel 124 from leaking into the volume 126 of the inner baffle, the inner member 118' may be crimped and sealed with solder 128, for example, at each end as shown in the cross-sectional view of FIG. 5.

The U-shape of the heat transfer fluid line 112 also facilitates in increasing the heat transfer between the air and the heat exchange apparatus 110. In particular, the U-shape doubles the length of heat transfer fluid line 112 and thus doubles the heat exchange surface area provided by the heat transfer fluid line 112. In addition, the U-shape may also facilitate in equalizing the heat transfer at locations along the length of the heat transfer fluid line 112. For example, the heat transfer fluid in the supply line 112A and the return line 112B is both the coldest and the warmest, respectively, at an end of the heat transfer fluid line 112 closest to the cooling module. On the other hand, the heat transfer fluid in the supply line 112A and the return line 112B are approximately equal in temperature at the opposite end of the heat transfer fluid line 112 furthest from the cooling module. Thus the heat transfer provided at the opposing ends as well as along the length of the heat transfer fluid line 112 may be at least partially equalized by utilizing the U-shaped heat transfer fluid line 112. The combination of the heat transfer fins 114, the increased turbulent flow and the U-shape of the heat transfer fluid line 112 decreases the overall thermal resistance of the heat transfer apparatus 110 and thus increases heat transfer.

Figure 6:
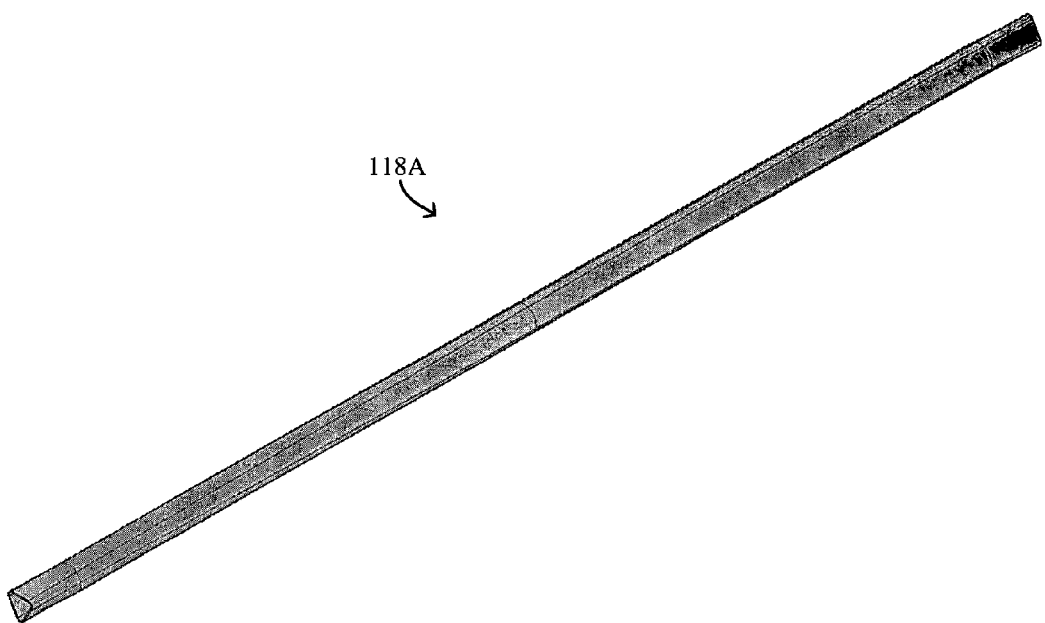
FIG. 6 is a perspective view of an alternative configuration of an inner baffle.

FIG. 6 is a perspective view of an alternative configuration of the inner member 118A. As shown, the inner member 118A may be generally cylindrical along most of its length and tapers to a somewhat crimped or otherwise triangulated shaped at its ends. The corners of the inner member 118A at the ends may contact an interior surface of the external channel 116 so as to define openings between the inner member 118A and the external channel. The openings may converge to become the annular channel along most of the length of the heat transfer fluid line 112 as the cross-sectional shape of the inner member 118A transforms from triangular at its ends to circular along most of its length. The ends of the inner member 118A may be closed off to prevent the heat exchange fluid in the annular channel 124 from leaking into the volume 126 of the inner member thus bypassing the flow restriction of the annular space. In particular, the ends of the inner member 118A may be closed off by soldering or with use of a cap or a plug, for example.

The cooling system including the heat exchange apparatus 110 and the cooling module 120 as described above provides substantial reductions in wasted cooling capacity and power consumption and in the allocation of resources for cooling. The cooling system can also achieve more uniform temperatures of the computer components. Because of the temperature uniformity and thus lack of a large temperature gradient or stratification among the computer components, the computer components can be operated at a higher temperature that is closer to the maximum temperature allowable for safe and efficient operation. In addition, the configuration of the cooling system also allows for the computer components or systems to be repaired and/or replaced without interference from the cooling system. Such a configuration thus facilitates in preserving the flexibility provided by the modular rack mounted systems in accommodating processing demands that may vary over time.

Figure 7:
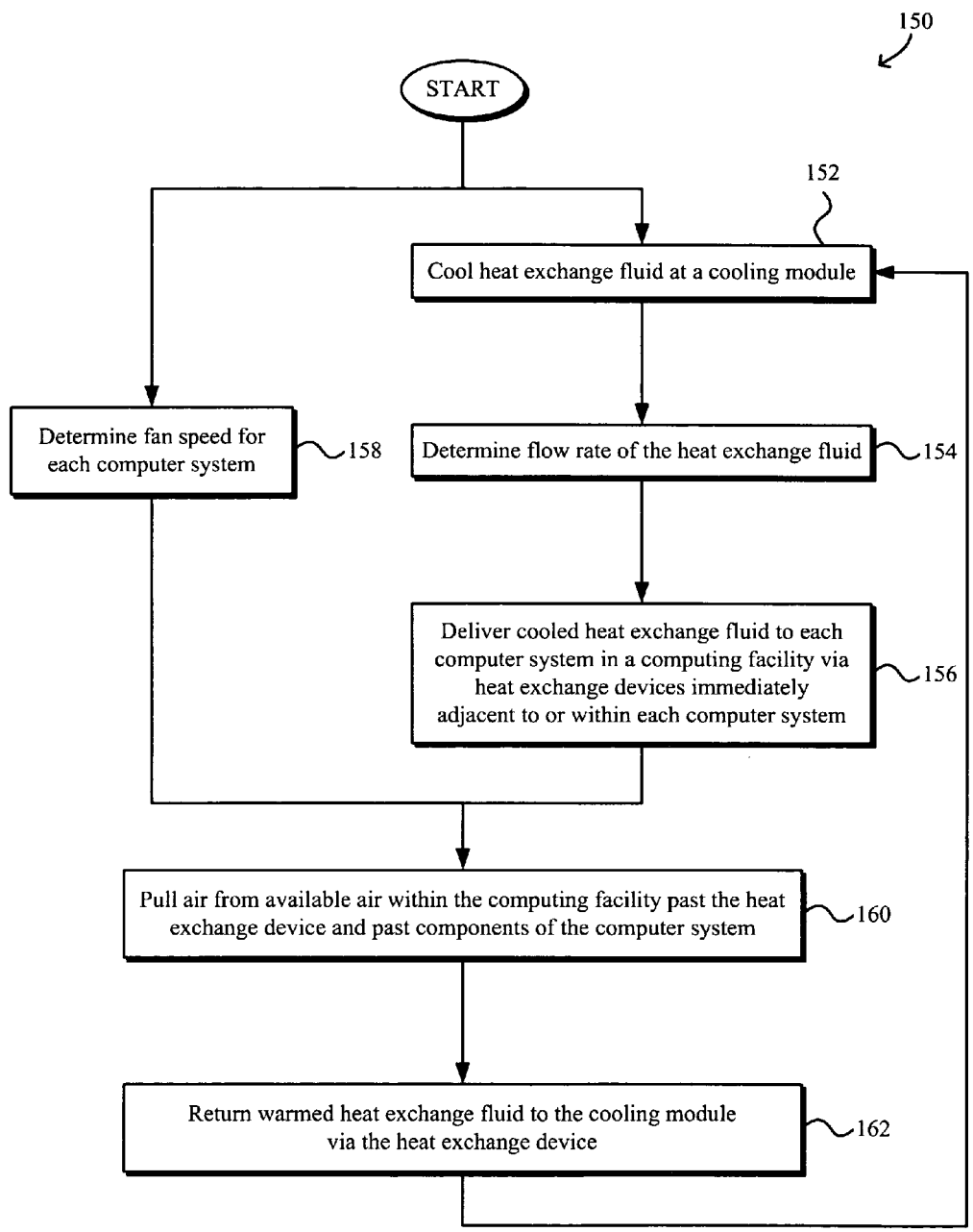
FIG. 7 is a flowchart illustrating a process for cooling electrical components such as components of computer systems.

FIG. 7 is a flowchart illustrating a process 150 for cooling electrical components such as components of computer systems. At block 152, a heat exchange fluid is cooled by a cooling module that may be external to or integrated within a computing facility in which the computer systems reside. At block 154, the flow rate of the heat exchange fluid may be determined and a valve such as a thermostatically controlled valve or a back pressure valve may be utilized to control the heat exchange fluid flow rate. At block 156, the cooled heat exchange fluid is delivered to each computer system in a computing facility via heat exchange devices located immediately adjacent to or within the confines or an enclosure of each computer system. At block 158, the fan speed for each computer system is determined. For example, the determination may be made by each computer system based on built-in temperature sensors, the power dissipated by the components, and/or the desired resultant cooled temperature of the components.

At block 160, the fans of the computer system operate to pull air from the available ambient air within the computing facility past the heat exchange device to cool the air. In cooling the air, the air may be pulled past numerous heat exchange fins attached to a heat transfer fluid line of the heat exchange device. The fans then pull the cooled air past the components of the computer system to cool the components. The warmed air is exhausted out of the enclosure or confines surrounding the computer system, e.g., the side walls of a rack housing the computer system and the tray of another computer system immediately above. At block 162, the warmed heat exchange fluid is returned to the cooling module via the heat exchange device to be cooled again at block 152 prior to re-circulating through the heat exchange device.

It is to be understood that the process 150 merely illustrates the various elements of a process for cooling electrical system components and that the various blocks of the process 150 may be performed simultaneously and/or in a different order from that presented in FIG. 7.

While the exemplary embodiments of the present invention are described and illustrated herein, it will be appreciated that they are merely illustrative and that modifications can be made to these embodiments without departing from the spirit and scope of the invention. For example, although the cooling system was described herein using the example of a computing facility containing rack mounted computer systems, the cooling system may be utilized to cool other or additional electronic components. Thus, the scope of the invention is intended to be defined only in terms of the following claims as may be amended, with each claim being expressly incorporated into this Description of Specific Embodiments as an embodiment of the invention.

What is claimed is:

1. A system for cooling electronic components, comprising:
a rack defining a plurality of slots, the rack holding a plurality of computer boards in the plurality of slots that support heat-generating computer components, the rack having open first and second sides that are opposed to each other and are open to circulation of ambient air from a computing workspace during operation of the system so as to permit fluid communication across the computer boards to an exterior of the rack, wherein the rack is one of a plurality of racks that are arranged to form a pair of rows on each side of a central aisle of the computing workspace, the computer boards each in a particular slot accessible through at least one of the open first and second sides through the central aisle of the computing workspace during cooling of the computer components in the particular slot by air cooled through one or more cooling coils corresponding to the particular slot, and wherein the rack has third and fourth opposed sides between the first and second sides, the third and fourth opposed sides not open to circulation of ambient air from the computing workspace;
a plurality of air circulation fans adjacent one of the open first or second sides, wherein each of the circulation fans is located near an edge of one of the computer boards and positioned to circulate cooling air across an associated board, wherein the air circulation fans provide cooling air over the computer boards, wherein cooling air circulated over a first computer board is separate from cooling air circulated over a second computer board adjacent the first computer board;
the one or more cooling coils associated with each of the plurality of boards and located near one, but not both, of the first or second sides of the rack; and
a fan controller corresponding to each air circulation fan to control the speed of the corresponding fan according to a temperature sensed around a board corresponding to the air circulation fan.

2. The system of claim 1, wherein the one or more cooling coils are positioned immediately adjacent to the plurality of circulation fans.

3. The system of claim 1, each rack in the plurality of racks having associated air fans, cooling coils, and fan controllers, and wherein the pair of rows is arranged on each side of the central aisle, the central aisle disposed lengthwise in a container that houses the plurality of racks, the cooling coils located on sides of the racks away from the aisle and near outside walls of the container.

4. The system of claim 3, further comprising a cooling module located outside the container and fluidly connected to the cooling coils at one end of the container.

5. The system of claim 1, further comprising a separate cooling coil for each computer in a rack of computers.

6. The system of claim 5, wherein the computer boards are mounted horizontally on shelves of the rack, and each of the air circulation fans is matched to a space between adjacent boards.

7. The system of claim 1, wherein the one or more cooling coils include coolant conduits having an external member and an inner baffle defining an annular channel therebetween and through which a cooling liquid flows.

8. The system of claim 1, wherein the cooling for each computer board is individually controlled by individually and separately controlling a fan speed, and thus air flow rate, for each computer board.

9. The system of claim 1, further comprising:
a valve in fluid communication with the cooling coil for modulating a cooling liquid to the cooling coil; and
a valve controller in communication with the fan controller, the valve controlled by the valve controller according to at least one of a temperature and a pressure of the cooling liquid.

10. A system for cooling electronic components, comprising:
first and second rows of computer racks arranged on each side of a central aisle, each rack including:
a frame structure defining a plurality of spaces and part of a computer rack of the row of computer racks that have open front and back sides that are adjacent lateral sides, the front and back sides open to circulation of ambient air from a computing facility within which the rows of computer racks are located during operation of the system, and the lateral sides not open to circulation of ambient air from the computing facility,
a plurality of computer boards holding computing components and mounted in the frame structure, wherein the plurality of computer boards each mounted in a particular space of the frame structure are accessible through at least one of the open front and back sides of the rack through the aisle during cooling of the computer components on the plurality of computer boards mounted in the particular space by air cooled through one or more cooling coils corresponding to the particular space of the frame structure;
a plurality of fans circulating air over the plurality of computer boards, each fan associated with a computer board and a temperature sensor near the computer board;
the one or more cooling coils arranged to cool air from the plurality of fans, wherein the cooled air is circulated over a first computer board to an exterior of the frame structure separately from the cooled air circulated over a second computer board adjacent the first computer board, the one or more cooling coils located near one, but not both, of the front and back sides of the rack; and
a plurality of fan controllers corresponding to the plurality of fans and programmed to control the speed of each fan according at least to a temperature sensed by each fan's associated temperature sensor.

11. The system of claim 10, wherein the open back side of each rack is adjacent an exterior wall of a container that holds the rows of computer racks and the one or more cooling coils located between the open back side and the exterior wall of the container.

12. The system of claim 11, wherein the racks extend substantially the length of the container.

13. The system of claim 10, further comprising a cooling module located outside the container and providing a cooling liquid to the plurality of cooling coils.

14. The system of claim 10, wherein the cooling coils include coolant conduits having an external member and an inner baffle defining an annular channel therebetween and through which a cooling liquid flows.

15. The system of claim 10, wherein the cooling for each computer board is individually controlled by individually and separately controlling a fan speed, and thus air flow rate, for each computer board.

16. A method for cooling electronic components, comprising:
providing a plurality of rack structures along opposed sides of a central aisle, each rack structure having an open first side and an open second side that are open to air circulation of ambient air with a computing facility in which the rack structures are located and lateral sides between the open first and second side that are not open to air circulation of ambient air with the computing facility, wherein the aisle is located adjacent one of the first and second open sides of the rack structures;
providing a plurality of computer boards in each rack structure in a manner to create open spaces between each of the next adjacent computer boards, each one of the plurality of computer boards accessible through at least one of the open first and second sides of each rack structure through the aisle during cooling of the computer components on each of the plurality of computer boards by air cooled through one or more cooling coils corresponding to each of the computer boards;
circulating air across the computer boards and through the cooling coils adjacent one, but not both, of the first and the second sides of each rack structure to an exterior of each rack structure using fans adjacent the second side of each rack structure, wherein each fan corresponds to a computer board, the circulated air across a first computer board separate from the circulated air across a second computer board adjacent the first computer board; and
controlling a speed of each fan using a sensed temperature around its corresponding board.

17. The method of claim 16, wherein providing a plurality of rack structures along opposed sides of a central aisle comprises providing a plurality of rack structures along opposed sides of a central aisle in a container, the open second sides of the plurality of rack structures located adjacent exterior walls of the container.

18. The method of claim 17, further comprising:
providing a cooling module located outside the container; and
fluidly connecting the cooling module to the cooling coils at one end of the container.

19. The method of claim 16, further comprising:
mounting the plurality of computer boards horizontally on shelves of the rack structure; and
matching each of the fans to a space between adjacent computer boards.

20. The method of claim 16, further comprising:
  providing at least one valve in fluid communication with the cooling coils;
  modulating a cooling liquid to the cooling coils through the valve; and
  controlling the valve according to at least one of a temperature and a pressure of the cooling liquid.

21. The method of claim 20, wherein providing at least one valve in fluid communication with the cooling coils comprises providing a cooling liquid to a coolant conduit having an external member and an inner baffle defining an annular channel therebetween and through which the cooling liquid flows, at least one of the cooling coils comprising the coolant conduit.

22. The method of claim 16, wherein controlling a speed of each fan using a sensed temperature around its corresponding board comprises individually and separately controlling a speed of each fan using a sensed temperature around its corresponding board.

* * * * *